United States Patent
Kwon

(10) Patent No.: US 9,196,323 B2
(45) Date of Patent: Nov. 24, 2015

(54) MEMORY DEVICE AND MEMORY SYSTEM INCLUDING THE SAME

(71) Applicant: SK hynix Inc., Gyeonggi-do (KR)

(72) Inventor: Jung-Hyun Kwon, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 101 days.

(21) Appl. No.: 14/106,829

(22) Filed: Dec. 15, 2013

(65) Prior Publication Data

US 2015/0043287 A1    Feb. 12, 2015

(30) Foreign Application Priority Data

Aug. 9, 2013 (KR) .................. 10-2013-0094754

(51) Int. Cl.
*G11C 7/10* (2006.01)
(52) U.S. Cl.
CPC ............ *G11C 7/1066* (2013.01); *G11C 7/1072* (2013.01); *G11C 7/1093* (2013.01); *G11C 7/1096* (2013.01); *G11C 2207/2254* (2013.01)
(58) Field of Classification Search
USPC .................................................. 365/189.05
See application file for complete search history.

(56) References Cited

U.S. PATENT DOCUMENTS

| | | | | |
|---|---|---|---|---|
| 5,933,385 A * | 8/1999 | Jiang | G11C 7/1072 | 365/104 |
| 6,226,766 B1 * | 5/2001 | Harward | G11C 29/12 | 714/719 |
| 6,295,620 B1 * | 9/2001 | Togo | G11C 29/36 | 714/719 |
| 6,449,545 B1 * | 9/2002 | Nitschke | B60R 21/01 | 701/32.7 |
| 7,167,955 B1 * | 1/2007 | Neils | G06F 11/1008 | 711/141 |
| 7,385,861 B1 * | 6/2008 | Zhu | G06F 13/4243 | 365/194 |
| 7,447,954 B2 * | 11/2008 | Shin | G11C 29/08 | 365/201 |
| 8,144,527 B2 * | 3/2012 | Bae | G11C 5/063 | 365/189.05 |
| 2012/0042204 A1 * | 2/2012 | Smith | G06F 11/1076 | 714/6.32 |
| 2012/0230125 A1 * | 9/2012 | Heo | G11C 7/1051 | 365/189.05 |
| 2014/0192583 A1 * | 7/2014 | Rajan | G11C 7/10 | 365/63 |

FOREIGN PATENT DOCUMENTS

KR    1020090026939    3/2009

* cited by examiner

*Primary Examiner* — Hoai V Ho
*Assistant Examiner* — Pablo Huerta
(74) *Attorney, Agent, or Firm* — IP & T Group LLP

(57) ABSTRACT

A memory system includes a controller suitable for providing a data to be written on a memory cell array and a control data for indicating whether or not the data has a preset data pattern and a memory device suitable for selectively writing an patterned data or the data provided by the controller on the memory cell array in response to the control data, wherein the patterned data is stored in the memory device and has the preset data pattern.

13 Claims, 3 Drawing Sheets

MEMORY DEVICE AND MEMORY SYSTEM INCLUDING THE SAME

CROSS-REFERENCE TO RELATED APPLICATIONS

The present application claims priority of Korean Patent Application No. 10-2013-0094754, filed on Aug. 9, 2013, which is incorporated herein by reference in its entirety.

BACKGROUND

1. Field

Exemplary embodiments of the present invention relate to a memory design technology, and more particularly, to a memory device and a memory system including the same.

2. Description of the Related Art

A memory device such as a dynamic random access memory (DRAM) receives data, which is to be written, from a controller and transmits data, which is read therefrom, to the controller. In case of a synchronous memory device, the controller and the memory device are synchronized with a system clock. During the transmission of data, a data strobe signal is used to synchronize the controller and the memory device for data communication.

Especially, the memory device performs a toggling operation to synchronize the data with an edge of the data strobe signal. The toggling operation is performed on the data irrespective of a type of data. For example, although the data have a predetermined pattern of "all one" or "all zero", e.g., '11111' or '00000', the memory device performs the toggle operation, which causes power consumption.

SUMMARY

Exemplary embodiments of the present invention are directed to a memory device and a memory system for improving an operation speed and reducing power consumption.

In accordance with an exemplary embodiment of the present invention, a memory system may include a controller suitable for providing a data to be written on a memory cell array and a control data for indicating whether or not the data has a preset data pattern and a memory device suitable for selectively writing an patterned data or the data provided by the controller on the memory cell array in response to the control data, wherein the patterned data is stored in the memory device and has the preset data pattern.

In accordance with an exemplary embodiment of the present invention, a memory device may include a memory cell array, a data pattern storage unit suitable for storing a plurality of patterned data and outputting one of the plurality of patterned data in response to a first control signal, a selection unit suitable for selectively transmitting of the patterned data outputted by the data pattern storage unit to the memory cell array in response to a second control signal and a control unit suitable for generating the first and second control signal based on a control data provided by an external device.

DETAILED DESCRIPTION

Figure 1:
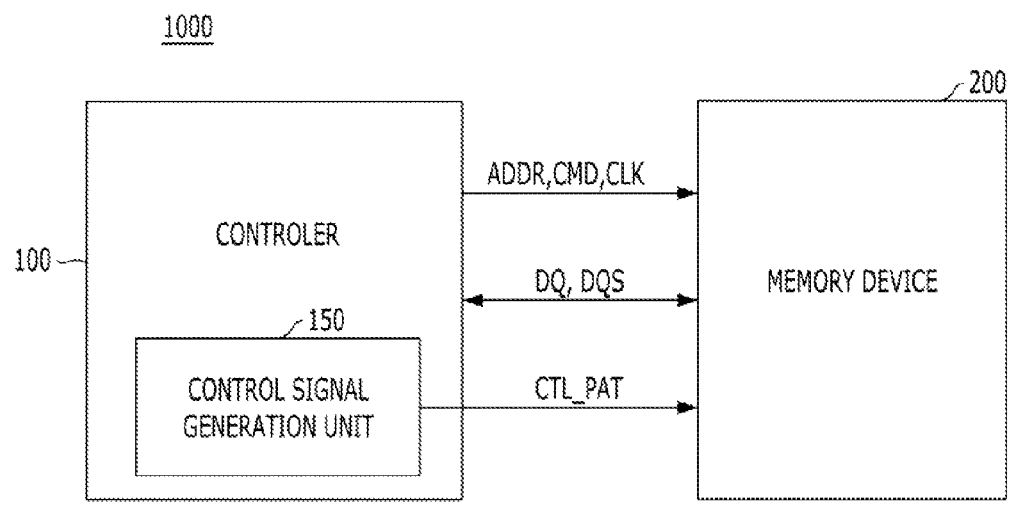
FIG. 1 is a block diagram illustrating an exemplary memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore 'include/comprise' or 'including/comprising' used in the specification represents that one or more components, steps, operations, and elements exists or are added.

FIG. 1 is a block diagram illustrating an exemplary memory system in accordance with an embodiment of the present invention.

Referring to FIG. 1, the memory system 1000 may include a controller 100 and a memory device 200.

The controller 100 may output an external command signal CMD a clock signal CLK and an address signal ADDR for controlling the memory device 200. The controller 100 may input and output a data strobe signal DQS and data DQ. The external command signal CMD may include a chip selection signal CS, a column address strobe signal CAS, a row address strobe signal RAS and a write enable signal WE.

The controller 100 may include a control signal generation unit 150 for outputting a control data CTL_PAT, which may indicate that the data DQ transmitted therewith has a preset data pattern. That is, when the memory device 200 receives a predetermined bit sequence of the preset data pattern from the controller 100, the controller 100 may output the control data CTL_PAT for indicating the preset data pattern. The preset data pattern may be a preset protocol between the controller 100 and the memory device 200. For example, data to be transferred to the memory device 200, which is the predetermined bit sequence with the preset data pattern of "all ones" or "all zeros", may be known to both of the controller 100 and the memory device 200.

The memory device 200 may operate in response to various signals provided from the controller 100. When the memory device 200 receives the preset data pattern from the controller 100, the memory device 200 may not perform the toggling operation to the preset data pattern or the data strobe signal DQS in response to the control data CTL_PAT received from the control signal generation unit 150 included in the controller 100. Thus, the memory device 200 may prevent the power consumption, which is caused by the toggling of the data DQ or the data strobe signal DQS.

When the memory device 200 receives data having the preset data pattern and the control data CTL_PAT from the controller 100, the memory device 200 in response to the control data CTL_PAT may use data stored therein and having the same pattern as the received data without toggling the received data.

Figure 2:
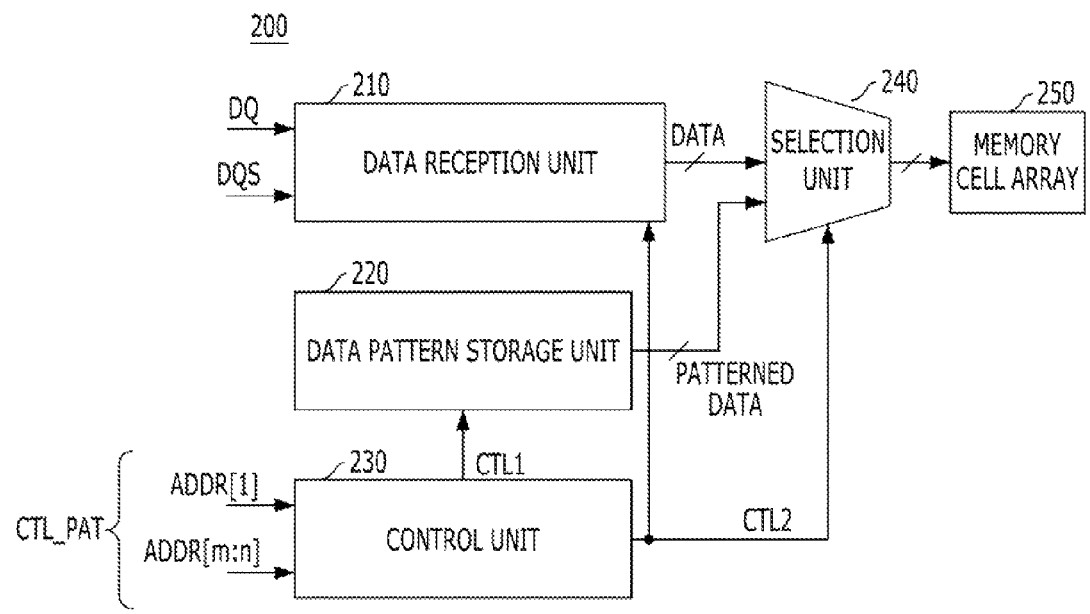
FIG. 2 is a block diagram illustrating an exemplary memory device in accordance with an embodiment of the present invention.

FIG. 2 is a block diagram illustrating an exemplary memory device in accordance with an embodiment of the present invention.

Referring to FIG. 2, a memory device 200 may include a data reception unit 210, a data pattern storage unit 220, a control unit 230, a selection unit 240, and a memory cell array 250.

The data reception unit 210 may receive a data strobe signal DQS and the data DQ from the controller 100. The data DQ and the data strobe signal DQS may be toggled by the data reception unit 210. The data DQ may be synchronized with the data strobe signal DQS.

The data pattern storage unit 220 may store a patterned data or the predetermined bit sequence having the preset data pattern. For example, the data pattern storage unit 220 may store the patterned data of 8 bits with value of "all ones" or "all zeros", e.g., '11111111' or '00000000'. The data pattern storage unit 220 may further store various data patterns, which are also known to the controller 100. That is, two data patterns such as '11111111' and '00000000' may be stored in the data pattern storage unit 220. The patterned data having the preset data pattern such as "11110000" and '10101010' may be further stored in the data pattern storage unit 220.

The control unit 230 may receive the control data CTL_PAT indicating whether or not the data DQ transferred therewith from the controller 100 has the preset data pattern. When the data DQ received from the controller 100 has the preset data pattern of the predetermined bit sequence, which is indicated by the control data CTL_PAT, the control unit 230 may control the data reception unit 210 not to toggle the received data DQ and the received data strobe signal DQS.

And, when the data DQ received from the controller 100 has the preset data pattern of the predetermined bit sequence, the control unit 230 may control the data storage unit 220 and the selection unit 240 in order to write the patterned data, which is stored in the data pattern storage unit 220, on the memory cell array 250.

The control data CTL_PAT may include a first signal ADDR[m:n] and a second signal ADDR[1]. The first signal ADDR[m:n] may include a plurality of bits and have information about the pattern of the data received with the control data CTL_PAT. The second signal ADDR[1] may indicate that the data received with the control data CTL_PAT have the preset data pattern of the predetermined bit sequence. In accordance with the embodiment of the present invention, the first signal ADDR[m:n] and the second signal ADDR[1] may be a redundant part of an address signal, which does not engage in selecting the memory cell array.

The control unit 230 may generate and output a first control signal CTL1 and a second control signal CTL2 in response to the first signal ADDR[m:n] and the second signal ADDR[1]. The data pattern storage unit 220 may operate in response to the first control signal CTL1. The data reception unit 210 and the selection unit 240 may operate in response to the second control signal CTL2.

The selection unit 240 may select and output one of the patterned data stored in the data pattern storage unit 220 and the data DATA outputted from the data reception unit 210 to the memory cell array 250 in response to the second control signal CTL2.

When the data DQ received from the controller 100 have the preset data pattern of the predetermined bit sequence, one of the plurality of patterned data stored in the data pattern storage unit 220 may be outputted to the selection unit 240 in response to the first control signal CTL1, in which the first signal ADDR[m:n] having information about the pattern of the received data DQ is reflected. And, the data reception unit 210 may disable the toggling operation to the received data DQ or the received data strobe signal DQS in response to the second control signal CLT2, in which the second signal ADDR[1] indicating that the received data have the preset data pattern of the predetermined bit sequence is reflected. That is, the selection unit 240 may select and output the patterned data outputted from the data pattern storage unit 220 to memory cell array 250.

On the contrary, when the data DQ received from the controller 100 does not have the preset data pattern of the predetermined bit sequence, the data pattern storage unit 220 may be disabled in response to the first control signal CTL1. And, the data reception unit 210 may enable the toggling operation to the received data DQ or the received data strobe signal DQS and output the result of the toggling operation as the data DATA in response to the second control signal CLT2. The selection unit 240 may select and output the data DATA outputted from the data reception unit 210 to the memory cell array 250.

As described above, when the preset data pattern of the predetermined bit sequence is received from the controller 100, the memory device 200 in accordance with the embodiment of the present invention may write the preset data pattern, which is stored in the data pattern storage unit 220, into each memory cell of the memory cell array 250 instead of processing, for example, toggling the preset data pattern transmitted from the controller 100. Thus, a power consumption caused by the toggling of the preset data pattern may be reduced and an operation speed of the memory device 200 may increase.

An operation of the memory system including the controller and the memory device will be described in details with a multi rank operation of the memory device 200.

A rank in the memory device 200 indicates a memory region, which operates independently in response to a chip selection signal. One of a plurality of memory chips in a memory module may be a single rank. When each of two or more memory cell arrays in a single memory chip is separated and operates independently, the single memory chip may have a plurality of ranks. Controlling the memory region as the single rank is referred to as a single rank operation.

When a plurality of data are written in the single rank operation, the plurality of data may be sequentially written on the memory cell array without synchronizing with the data strobe signal DQS.

When the plurality of data are written in a different rank during a multi rank operation, the plurality of data may be written after one or two cycles that are required for the data strobe signal DQS to be synchronized.

Figure 3:
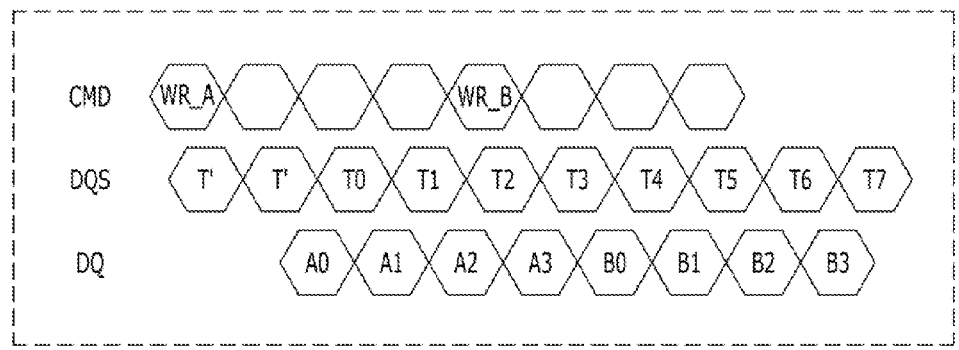
FIG. 3 is a timing diagram illustrating a single rank operation mode of a memory device in accordance with an embodiment of the present invention.

FIG. 3 is a timing diagram illustrating a single rank operation mode of a memory device in accordance with an embodiment of the present invention.

Referring to FIG. 3 in a single rank operation mode, after a first write command WR_A is inputted, a second write command WR_B is sequentially inputted. In case of a back-to-back type where data may be written sequentially, when data are to be written in a same rank, the data are outputted to the memory cell array without synchronizing with the data strobe signal DQS.

Figure 4:
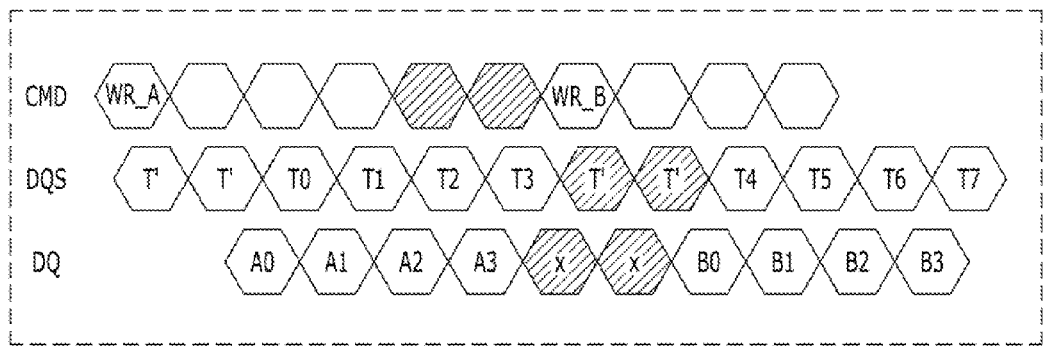
FIG. 4 is a timing diagram illustrating a conventional multi-rank operation mode.

FIG. 4 is a timing diagram illustrating a conventional multi rank operation mode.

Referring to FIG. 4, when the data is written on a memory cell included in a different or changed rank, it takes a time of 2*T to synchronize with the data strobe signal DQS according to the change of rank, where 'T' is referred to as a cycle of the data. That is, after a controller 100 provides a write command WR_A, when a write command WR_B is inputted in the different or changed rank, it takes the time of 2*T to synchronize data DQ with the data strobe signal DQS.

Figure 5:
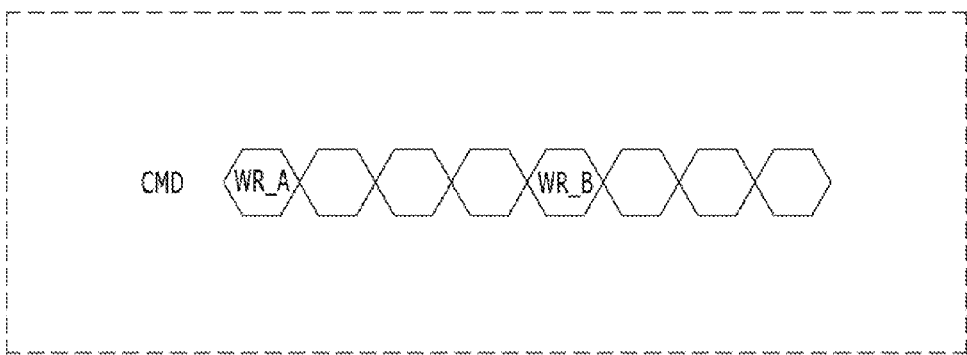
FIG. 5 is a timing diagram illustrating an exemplary multi-rank operation mode of a memory device in accordance with an embodiment of the present invention.

FIG. 5 is a timing diagram illustrating an exemplary multi rank operation mode of a memory device in accordance with an embodiment of the present invention.

Referring to FIG. 5, when a preset data pattern is confirmed by the controller 100 using the control data, an input timing of a command to be transferred to the memory device 200 may be shortened by the amount of 2*T. In the embodiment of the present invention, when data to be transferred to the memory device 200 have the preset data pattern, the preset data pattern, which is stored in the data pattern storage unit 220, is written into each memory cell of the memory cell array 250 instead of process, for example, the toggling operation to the preset data pattern transmitted from the controller 100, and thus it is not necessary to synchronize the data DQ with the data strobe signal DQS.

In conclusion, during a multi rank operation mode, it is not necessary to synchronize the data DQ to be written on the different or changed rank with the data strobe signal DQS after a write operation to one rank is completed. Thus, after a controller 100 provides the write command WR_A, when the write command WR_B is inputted in the different or changed rank, the amount of time of 2*T is not required because the synchronization is not required.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
  a controller suitable for providing a data to be written on a memory cell array and a control data for indicating whether or not the data has a preset data pattern; and
  a memory device suitable for selectively writing a patterned data or the data provided by the controller on the memory cell array in response to the control data,
  wherein the patterned data is stored in the memory device and has the preset data pattern,
  wherein the control data has information about the pattern of the data provided from the controller and indicates whether or not the data provided from the controller have the same data pattern as the patterned data stored in the memory device.

2. The memory system of claim 1, wherein the memory device comprises:
  a data pattern storage unit suitable for storing the patterned data and outputting the patterned data in response to a first control signal;
  a selection unit suitable for selectively transmitting the patterned data outputted by the data pattern storage unit to the memory cell array in response to a second control signal; and
  a control unit suitable for generating the first and second control signals based on the control data provided by the controller.

3. The memory system of claim 2, wherein the first control signal has information about the pattern of the data provided from the controller and the second control signal indicates whether or not the data provided from the controller have the same data pattern as the patterned data stored in the data pattern storage unit.

4. The memory system of claim 3, wherein the data pattern storage unit outputs the patterned data when the data provided from the controller have the same data pattern as the patterned data stored in the data pattern storage unit.

5. The memory system of claim 3, wherein the selection unit transmits the patterned data outputted by the data pattern storage unit to the memory cell array when the data provided from the controller have the same data pattern as the patterned data stored in the data pattern storage unit.

6. The memory system of claim 3, further comprising a data reception unit suitable for toggling the data from the controller and synchronizing the data with a data strobe signal,
  wherein the data reception unit is disabled in response to the second control signal.

7. The memory system of claim 1, wherein the control data is included in a redundant part of an address signal, which is provided from the controller to the memory device, and the redundant part does not engage in selecting the memory cell array of the memory device.

8. A memory device, comprising:
  a memory cell array;
  a data pattern storage unit suitable for storing a plurality of patterned data and outputting one of the plurality of patterned data in response to a first control signal;
  a selection unit suitable for selectively transmitting of the patterned data outputted by the data pattern storage unit to the memory cell array in response to a second control signal; and
  a control unit suitable for generating the first and second control signal based on a control data provided by an external device,
  wherein the control data has information about the pattern of the data provided from the external and indicates whether or not the data provided from the external device have the same data pattern as the patterned data stored in the data pattern storage unit.

9. The memory device of claim 8, wherein the first control signal has information about the pattern of the data provided from the external device and the second control signal indicates whether or not the data provided from the external device have the same data pattern as the patterned data stored in the data pattern storage unit.

10. The memory device of claim 8, wherein the data pattern storage unit outputs the patterned data when the data provided from the external device have the same data pattern as the patterned data stored in the data pattern storage unit.

11. The memory device of claim 8, wherein the selection unit transmits the patterned data outputted by the data pattern storage unit to the memory cell array when the data provided from the external device have the same data pattern as the patterned data stored in the data pattern storage unit.

12. The memory device of claim 8, further comprising a data reception unit suitable for toggling the data from the external device and synchronizing the data with a data strobe signal, wherein the data reception unit is disabled in response to the second control signal.

13. The memory device of claim 8, wherein the control data is included in a redundant part of an address signal, which is provided from the external device to the memory device, and the redundant part does not engage in selecting the memory cell array.

\* \* \* \* \*